United States Patent
Nagahara et al.

(10) Patent No.: US 6,763,716 B2
(45) Date of Patent: Jul. 20, 2004

(54) SEMICONDUCTOR ACCELERATION SENSOR

(75) Inventors: Teruaki Nagahara, Tokyo (JP); Hiroshi Otani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/270,045

(22) Filed: Oct. 15, 2002

(65) Prior Publication Data

US 2003/0159513 A1 Aug. 28, 2003

(30) Foreign Application Priority Data

Feb. 18, 2002 (JP) ........................................ 2002-040039

(51) Int. Cl.[7] .......................... G01P 1/02; G01P 15/125
(52) U.S. Cl. ........................................ 73/493; 73/514.32
(58) Field of Search ............................. 73/493, 514.16, 73/514.35, 514.36, 514.17, 514.18, 514.21, 514.32; 257/724, 778, 780

(56) References Cited

U.S. PATENT DOCUMENTS

| | | | | |
|---|---|---|---|---|
| 5,347,867 A | * | 9/1994 | Pangerl | 73/517 R |
| 5,545,912 A | * | 8/1996 | Ristic et al. | 257/417 |
| 5,864,062 A | * | 1/1999 | Nagahara et al. | 73/514.01 |
| 5,864,063 A | * | 1/1999 | Otani et al. | 73/514.32 |

FOREIGN PATENT DOCUMENTS

JP        11-230986         8/1999

OTHER PUBLICATIONS

US 2002/0073780 A1, Katsumata et al., Pub. Date Jun. 20, 2002.*
U.S. patent application Ser. No. 10/270,045, Nagahara et al., filed Oct. 15, 2002.
U.S. patent application Ser. No. 10/654,002, Naghara, filed Oct. 4, 2002.

* cited by examiner

Primary Examiner—Helen Kwok
(74) Attorney, Agent, or Firm—Oblon, Spivak, McClelland, Maier & Neustadt, P.C.

(57) ABSTRACT

A sensor chip connected to a signal processing IC is provided on a die pad, a stationary electrode and a movable electrode are arranged on a semiconductor substrate of the sensor chip, the stationary electrode and movable electrode are covered with a protective cap, a shield electrode layer is embedded in a top face part of a semiconductor substrate, and these elements are sealed with a sealing resin, thus, a potential of the movable electrode is obtained from an output potential of a capacity/voltage conversion circuit of a signal processing IC, and at least one of the shield electrode layer and protective cap is electrically connected to the movable electrode to thereby make identical to each other in potential.

13 Claims, 10 Drawing Sheets

SEMICONDUCTOR ACCELERATION SENSOR

BACKGROUND OF THE INVENTION

1. Field of the Invention

The present invention generally relates to a semiconductor acceleration sensor, and more particularly, to improvement of a semiconductor acceleration sensor for use in an air bag system of automobile, an antilock braking system (ABS), a navigation system, or other commercially available equipment and the like.

2. Description of the Prior Art

In recent years, in an air bag system of an automobile or the like, a system using an acceleration sensor has been installed as standard. An essential device part of this air bag system is an acceleration sensor for sensing a shock (acceleration). A conventional differential capacity type acceleration sensor is provided with a beam part supported by an anchor part, a movable part of a movable electrode and a mass (balance) part, and a stationary electrode part disposed to be opposed to the movable electrode, thereby detecting an acceleration according to a capacity change between the movable electrode and the stationary electrode based on a displacement of the movable part.

That is, the semiconductor acceleration sensor is composed of a sensor chip part for detecting an acceleration and a signal processing part for forming/amplifying a signal of the sensor chip. In the principle of detecting the acceleration of such an acceleration sensor, a movable electrode (mass body) positioned between a pair of stationary electrodes is displaced when subjected to an acceleration. As a result, a capacity change occurring between the stationary electrode and the movable electrode is converted into an electrical signal, thereby detecting an acceleration.

However, when in operation of the conventional acceleration sensor, there has been a problem that an electrostatic force is generated due to a potential difference between a movable electrode (mass part) and a substrate, the movable electrode or mass part adheres to the substrate, and does not function. In order to prevent the movable part from adhering to the substrate, for example, Japanese Unexamined Patent Publication No. 11-230986 discloses providing a stopper part partially protruded to the substrate and preventing the movable electrode from adhering to the substrate in all of the movable electrode, the beam part, and the lower part of the mass part.

On the other hand, in recent years, almost all of automobiles have acceleration sensors installed therein. There is a growing need for smaller and low-cost sensors. Although sensors were of metal packages at an initial stage, they are mostly replaced with those of mold resin packages. Thus, there occurs a problem that sensors made of a mold resin are easily affected by an external noise as compared with those of a metal package, and its shied effect is lowered.

Figure 1:
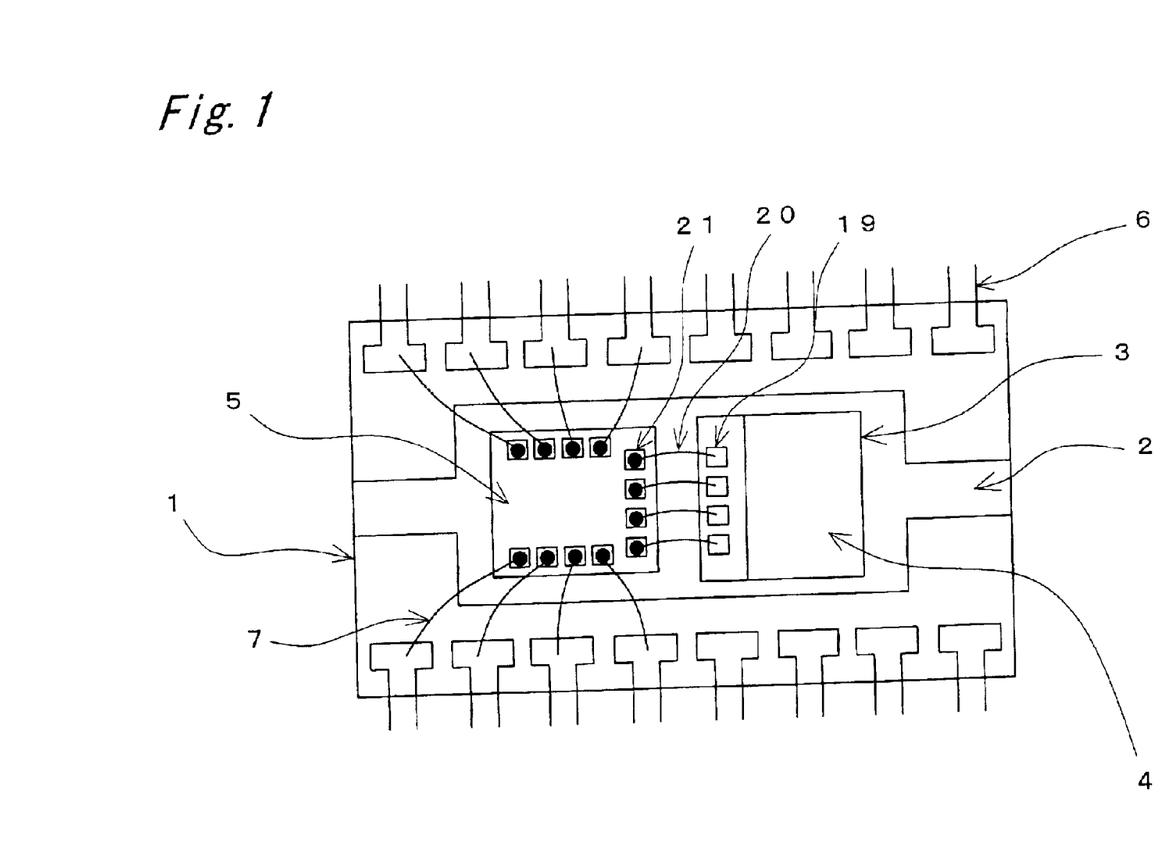
FIG. 1 is a view showing general disposition and arrangement of an improved semiconductor acceleration sensor.
Figure 2A:
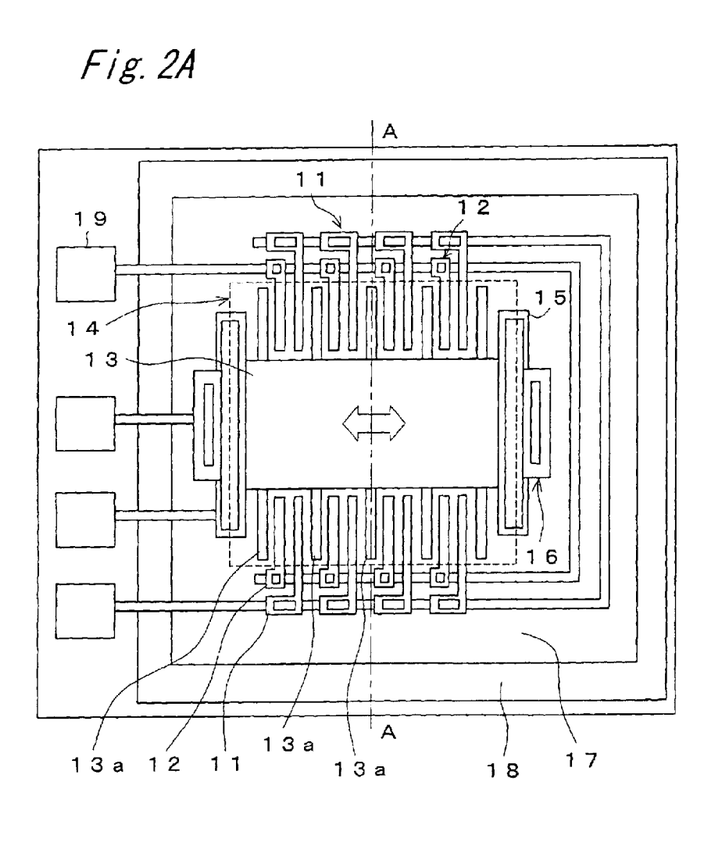
FIG. 2A is a top view showing a sensor chip structure of the improved semiconductor acceleration sensor of FIG. 1.
Figure 2B:
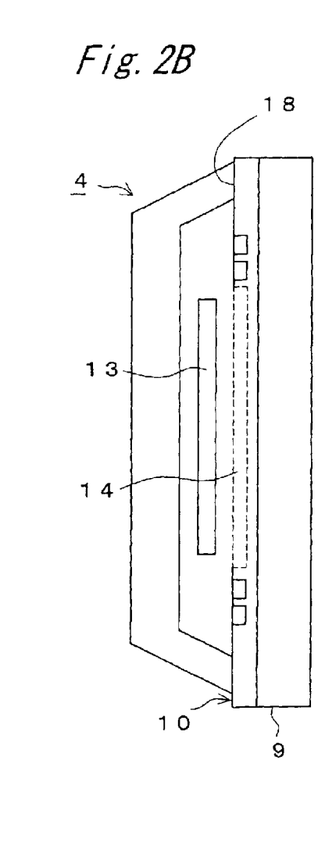
FIG. 2B is a sectional view taken along the line A—A in FIG. 2A.

In order to solve the above-described problem, the inventors of the present application made effort to improve an acceleration sensor as shown in FIGS. 1, 2A and 2B. FIG. 1 is a view showing a schematic disposition and arrangement of this improved semiconductor acceleration sensor. FIG. 2A is a top view showing a sensor chip arrangement thereof, and FIG. 2B is a sectional view taken along the line A—A shown in FIG. 2A.

In an assembly disposition and arrangement between the signal processing chip part and sensor chip part of the semiconductor acceleration sensor shown in FIG. 1, a die pad 2 and an external lead 6 are provided in a package exterior part 1, and a sensor chip 3 for detecting an acceleration and a signal processing chip 5 (hereinafter, referred to as "signal processing IC" or "ASIC") for forming/amplifying a signal of the sensor chip are disposed on the top face of the die pad 2.

Pads 19 and 22 opposed to each other on the sensor chip 3 and the signal processing chip 5 are connected to each other via a metal wire 20, and pads disposed in a horizontal direction on the signal processing chip 5 are connected to external leads 6 via metal wires 7. In addition, on the sensor chip 3, there is provided a sealed structure in which a protective cap 4 made of an electrically conductive material such as silicon is provided in order to protect a movable part for detecting acceleration from a mold resin. In such a sensor chip 3, its electrode structure is formed in accordance with a surface micro-machining technique.

In a structure of the sensor chip 3, as shown in FIGS. 2A and 2B, an insulation oxide film 10 functioning as an insulation layer with a silicon substrate 9 is formed on the silicon substrate 9, and a first stationary electrode 11 and a second stationary electrode 12 made of a polysilicon material are disposed in plurality on the top face of the insulation oxide film 10. These first and second stationary electrodes 11 and 12 are connected to aluminum pads 19 arranged on the top face of the substrate 9 via a polysilicon wire 17. A shield electrode layer 14 to which a stationary potential (such as GND) is provided is formed to be embedded at the center of the top face part of the insulation oxide film 10, and a polysilicon wire is disposed at a periphery of the shield electrode layer 14.

In addition, a pair of beam structures 15 formed by groove-separating monocrystal silicon are formed, for example, on the top face part of the substrate 9. The beam structure 15 is cross-linked by a pair of anchor parts 16 protruding from the side of the substrate 9, is disposed at a position spaced from the top face stationary part of the substrate 9 with predetermined intervals, and is arranged so as to be movable due to beam displacement.

A main body (mass part) of the movable electrode 13 of elongated polysilicon is cross-linked between a pair of beam structures 15. The movable electrode 13 has a plurality of movable electrode protrusions 13a protruding in parallel to its side face part with equal intervals, and the first and second stationary electrodes 11 and 12 are disposed to be opposed to its side face with substantially equal intervals between the movable electrode protrusions 13a. The protective cap 4 is bonded to sealed with a cap mounting part 18 on the top face of the insulation oxide film 10 so as to cover these movable electrode part, stationary electrode part, and beam structures or the like.

In this manner, an electrode structure produced by using a micro-machining technique is very fine, and a fine capacity change is detected. Thus, this structure is easily affected by an externally applied potential (such as a noise), and sensor characteristics may be degraded. Therefore, in general, the shield electrode 14 to which the stationary potential (such as GND) is provided is disposed at the lower part of the movable electrode 13, and an effect due to an external potential (such as a noise) is eliminated, thereby suppressing such an external noise or the like.

However, in the case where the stationary potential is provided to such a shield electrode, the potential of the movable electrode is changed due to an acceleration. Thus, in the case where a potential difference with respect to the shield electrode becomes significant, there is a possibility that the movable electrode is attracted to, and is securely bonded with the shield electrode due to electrostatic attracting force, and then, becomes inoperable.

In general, the above-described protective cap 4 is usually made of an insulation material such as low melting point glass, and is pasted on a substrate. Thus, there is a problem that the potential of the protective cap is in a floating state, and a proper shield effect cannot be achieved.

SUMMARY OF THE INVENTION

The present invention has been made in order to solve the above-described problems. It is an object of the present invention to provide a small, low-cost semiconductor acceleration sensor in which the movable electrode of the semiconductor acceleration sensor is prevented from being securely bonded with the substrate with an electrostatic attracting force and from being inoperable, and in which there is solved a problem on achieving proper shield effect.

In a semiconductor acceleration sensor of the present invention, a potential identical to that of a movable electrode is given to a shield electrode, whereby disposition and arrangement for connecting a sensor chip and a signal processing IC to each other are improved so that a potential difference is eliminated between the movable electrode and the shield electrode, and an electrostatic attracting force does not occur, the secure bonding of the movable electrode is reliably prevented, and a shield effect is improved.

In order to achieve the foregoing object, according to an essential aspect of the present invention, a semiconductor acceleration sensor includes: a sensor chip connected to a signal processing IC on a die pad; a stationary electrode and a movable electrode which are arranged on a semiconductor substrate of the sensor chip; a protective cap covering the stationary electrode and movable electrode; a shield layer which is embedded in a top face part of the semiconductor substrate; and a sealing resin for sealing the stationary electrode and the movable electrode. In this configuration, at least one of the shield layer and the protective cap is electrically connected to the movable electrode, thereby being identical to each other in potential.

With the above-described arrangement, there can be provided a semiconductor acceleration sensor in which the movable electrode is prevented from being securely bonded with the substrate by an electrostatic attracting force and being inoperable, and the entire arrangement is simple and inexpensive.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Before the description proceeds, it is to be noted that, since the basic structures of the preferred embodiments are in common, like parts are designated by the same reference numerals throughout the accompanying drawings.

Embodiments of the present invention will be described referring to FIGS. 3A, 3B to 10. Same common elements in the figures are designated by same reference numerals, and a duplicate description is omitted here.

Embodiment 1

Figure 3A:
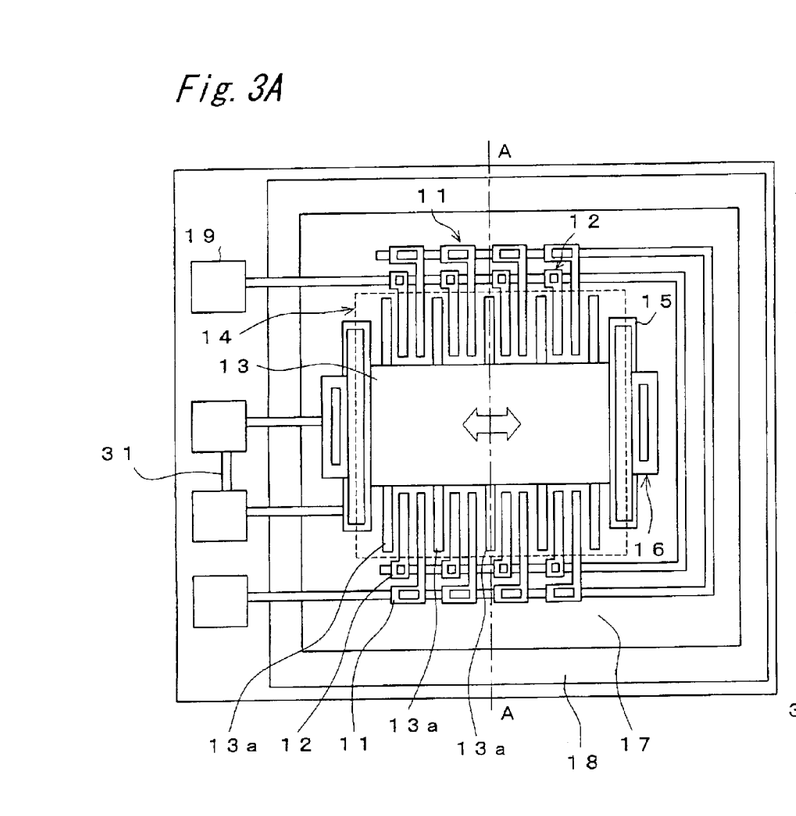
FIG. 3A is a top view showing a sensor chip structure of a semiconductor acceleration sensor in the case where a shield electrode and a movable electrode are directly connected to each other and FIG. 3B is a sectional view taken along the cutting line A—A in the embodiment 1 of the present invention.
Figure 3B:
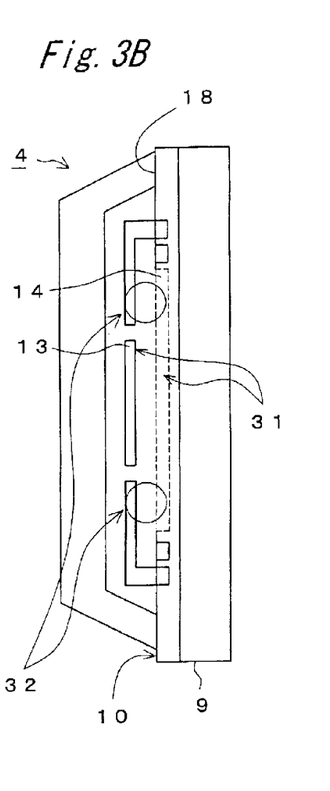
Figure 4:
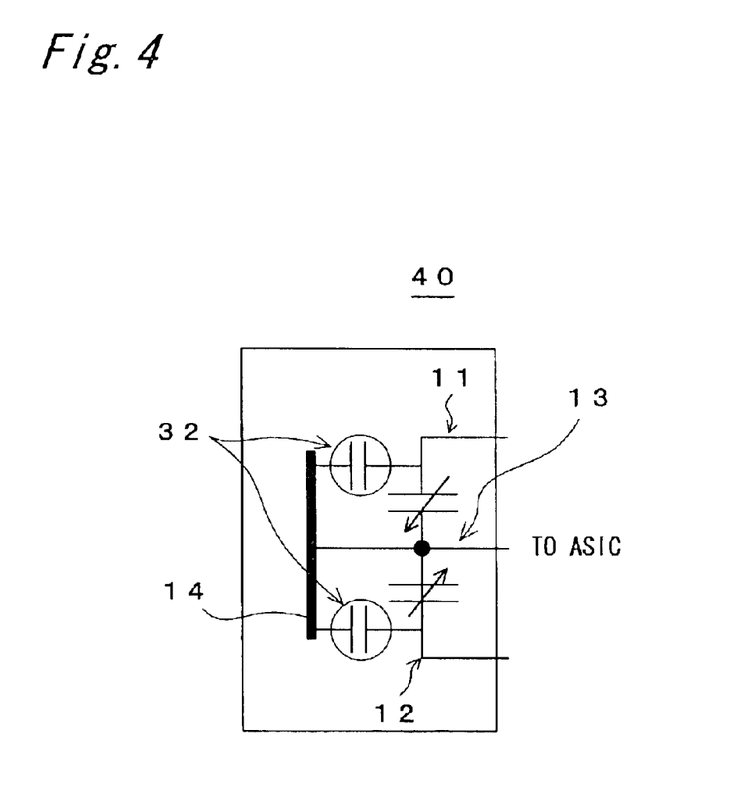
FIG. 4 is a diagram of a sensor chip part equivalent circuit illustrating a parasitic capacity generated in the sensor chip structure of the semiconductor acceleration sensor shown in FIG. 3A.
Figure 5:
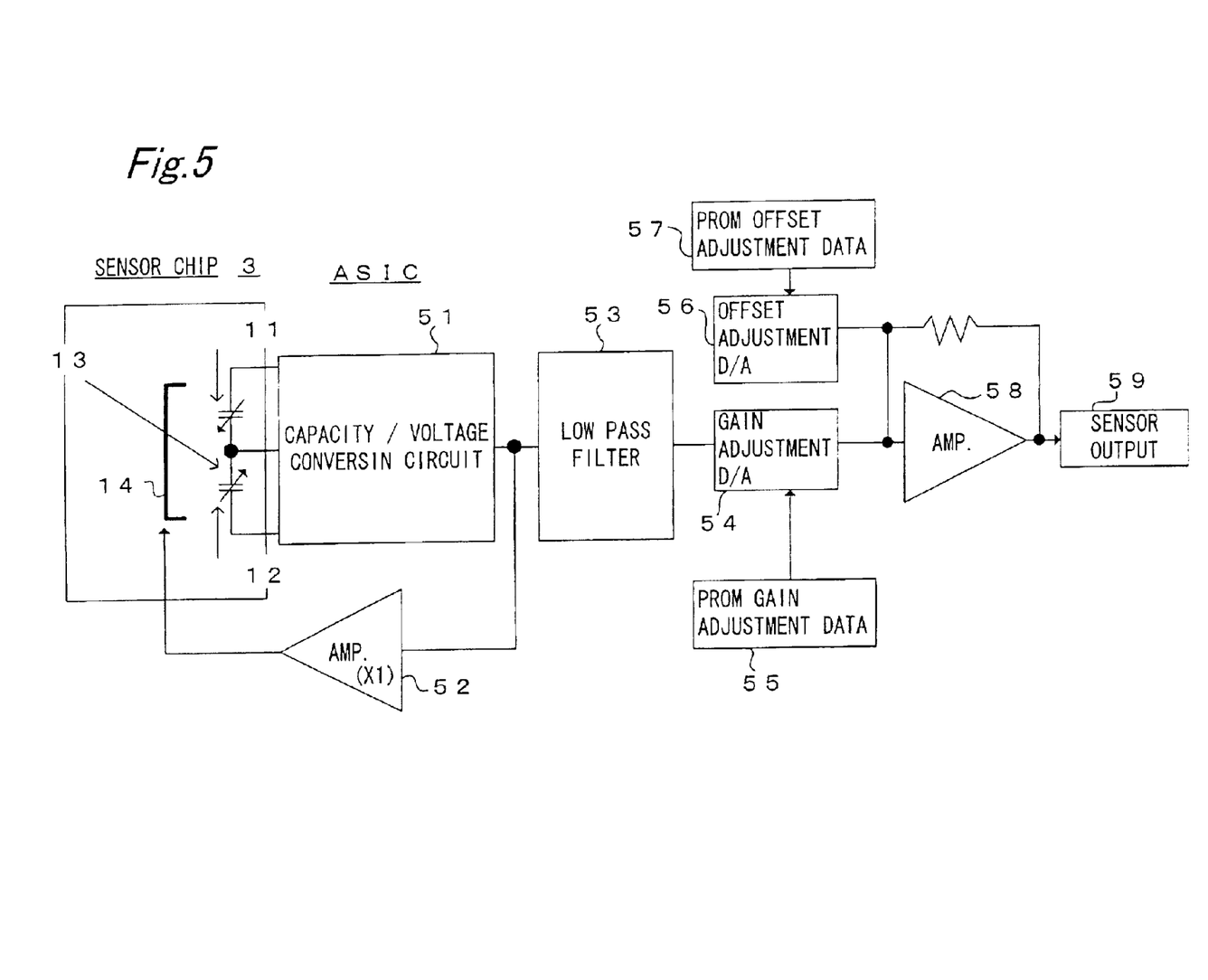
FIG. 5 is a circuit block diagram illustrating an assembly arrangement of a sensor chip part and a signal processing part according to the embodiment 1 of the present invention.

An embodiment 1 of the present invention will be described below referring to FIGS. 3A, 3B to 5. FIGS. 3a and 3B illustrate the embodiment 1. In a basic arrangement shown in FIGS. 2A and 2B, FIG. 3A is a top view showing a sensor chip structure of a semiconductor acceleration sensor and FIG. 3B is a sectional view taken along the cutting line A—A to illustrate a parasitic capacity that occurs in the case where the shield electrode and movable electrode are directly connected to each other. FIG. 4 is a circuit diagram depicting a sensor chip part equivalent circuit 40 provided to illustrate the above-described parasitic capacity. FIG. 5 is a circuit diagram provided to illustrate an assembly arrangement of the sensor chip part and signal processing part (ASIC) of the embodiment 1.

In the previously described sensor chip arrangement shown in FIGS. 1, 2A and 2B, a stationary potential (such as GND) has been provided to the shield electrode 14. In the case of such an arrangement, however, as described previously, the potential of the movable electrode is changed due to acceleration. Thus, in the case where the potential difference with respect to the shield electrode becomes significant, there is a possibility that the movable electrode is securely attracted to the shield electrode due to an electrostatic attracting force, and is inoperable. Because of this, in the embodiment 1, there is an arrangement in which a potential whose value is identical to that of the movable electrode fluctuating relevant to a change of acceleration is provided to the shield electrode instead of providing a stationary potential (such as GND) to the shield electrode 14.

A potential identical to that of the movable electrode may be easily provided to the shield electrode if the movable electrode and shield electrode can be directly connected to each other. However, as shown in FIGS. 3A and 3B, in the case where both of the electrodes are directly connected to each other via a direct connection part 31, in the sensor chip part equivalent circuit 40 shown in FIG. 4, there is a possibility that a parasitic capacity 32 is generated in parallel between the stationary electrode 11 (12) and movable electrode 13, where the parasitic capacity is an intrinsic acceleration detection capacity. As a result, the sensitivity of the sensor is lowered, and an acceleration cannot be detected with high precision.

As shown in FIG. 5, an output of a capacity/voltage conversion circuit 51 in the signal processing ASIC 5 connected to the sensor chip 3 is identical to that of the movable electrode 13 in potential, and thus, is arranged so as to provide the output of the capacity/voltage conversion circuit 51 to a pad of the shield electrode 14 of the sensor chip 3 via an amplification circuit 52.

In the circuit arrangement shown in FIG. 5, the signal processing ASIC 5 is provided with: a low pass filter 53 for filter processing an output of the capacity/voltage conversion circuit 51; a gain adjustment D/A converter 54 for gain adjusting a value obtained from the low pass filter 53; an offset adjustment D/A converter 56 having PROM offset adjustment data 57 further provided thereto; means 55 for providing PROM gain adjustment data to the gain adjustment D/A converter 54; an amplification circuit 58 for amplifying a value obtained by the gain adjustment D/A converter 54; and a sensor output part 59 or the like.

In this manner, the output of the capacity/voltage conversion circuit 51 identical to the movable electrode 13 in potential is provided to the pad of the shield electrode 14, whereby the secure bonding of the movable electrode can be prevented without lowering the sensitivity of the sensor.

With the above-described arrangement, a proper shield effect is achieved, and a potential difference between the movable electrode and shield electrode is eliminated. In addition, no electrostatic attracting force is generated. Thus, there is achieved an effect that the secure bonding of the movable electrode can be prevented as well.

Embodiment 2

Figure 6:
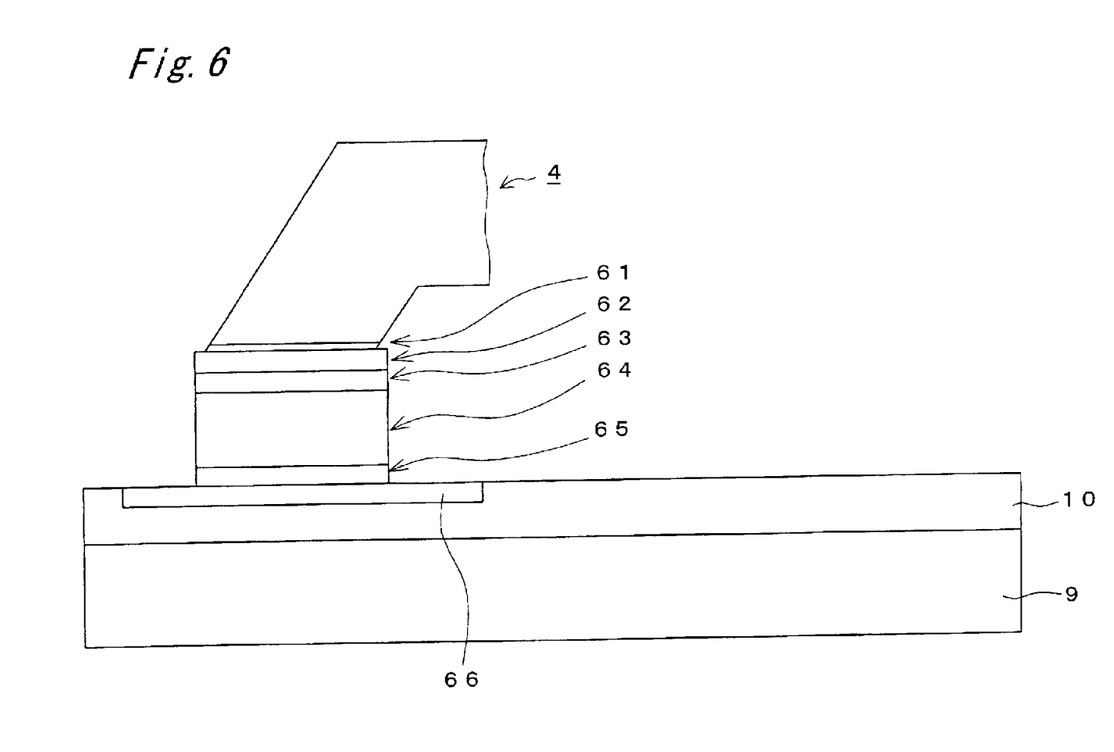
FIG. 6 is a view showing a sectional structure of a protective cap bonding part of a sensor chip according to the embodiment 2 of the present invention.
Figure 7:
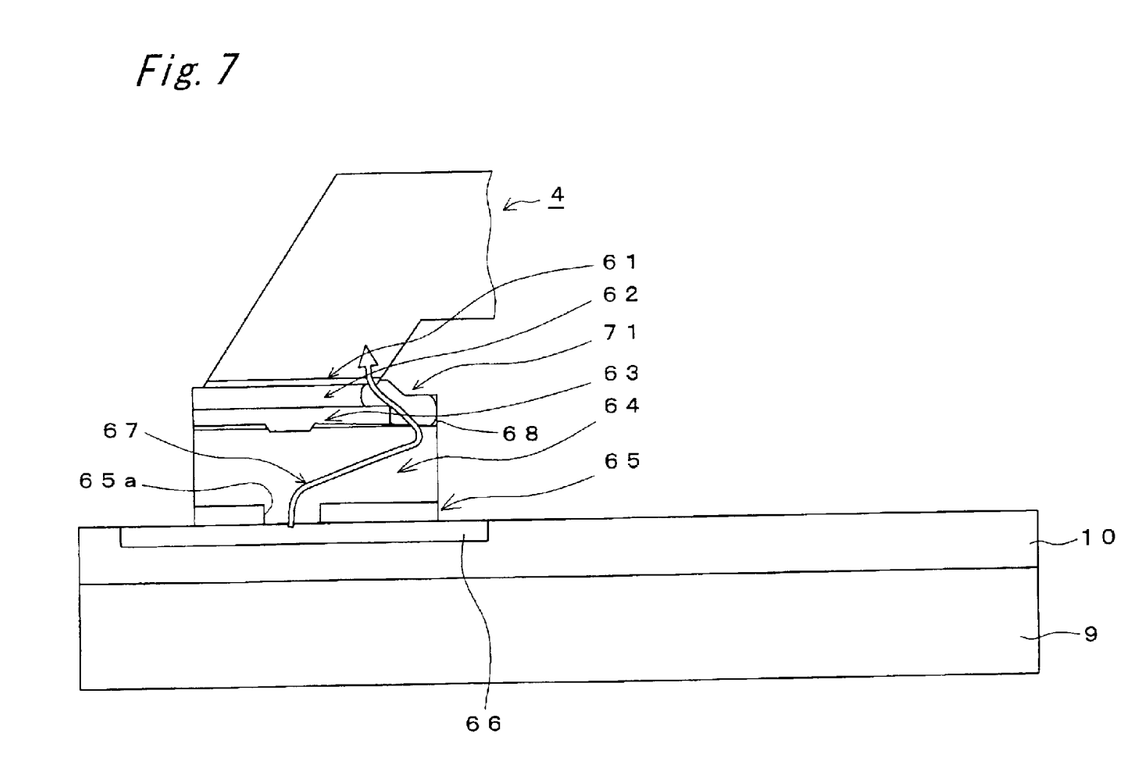
FIG. 7 is a sectional view showing how to take conductivity between a protective cap and a shield electrode wiring layer according to the embodiment 2 of the present invention.

An embodiment 2 of the present invention will be described below referring to FIGS. 6 and 7. The embodiment 2 shows a cap bonding structure for providing a potential to the above-mentioned protective cap 4. FIG. 6 shows a sectional structure of a protective cap bonding part provided to illustrate the embodiment 2. FIG. 7 shows a sectional structure showing how to obtain conductivity between the protective cap and the doped polysilicon wire of the shield electrode.

In general, the protective cap 4 for sealing the movable electrode part, the stationary electrode part, and the beam structure or the like is made of an insulation material such as low melting point glass, and is bonded to be sealed with the cap mounting part 18 via the insulation oxide film 10 on the substrate of the sensor chip 3. The present embodiment 2 describes a cap bonding method for providing a potential to the protective cap 4 and a structure thereof.

As shown in FIG. 6, a Ti/Ni film 61 laminated on the lower face of the protective cap 4 is employed as a protective cap bonding method, and eutectic bonding in which an eutectic bonding is generated by heating is employed. In forming an adhesive bonding part during eutectic bonding, first, on the silicon substrate 9 of the sensor chip 3, the insulation nitride film 65 is formed on the doped polysilicon wiring layer 66 for the purpose of insulation between the doped polysilicon wiring layer 66 of the shield electrode and a base of the bonding part. Next, on this insulation nitride film 65, a doped polysilicon film 64 serving as a base during cap bonding is formed. The insulation nitride film 65 is thus interposed, thereby preventing short-circuit of wiring.

Next, an insulation oxide film 63 is formed on the doped polysilicon film 64. On this insulation oxide film 63, a bonding non-doped polysilicon layer 62 used for cap bonding is laminated. Such a laminate structure and the Ti/Ni film 61 laminated on the lower face of the protective cap 4 are pasted on each other by eutectic bonding, and the protective cap 4 is bonded on the substrate of the sensor chip 3.

Here, a reason for using the non-doped polysilicon film 62 and insulation oxide film 63 is that, in the case where the Ti/Ni film 61 and doped polysilicon film 64 are directly bonded with each other, impurities doped by a heat during bonding are precipitated on a surface, disabling bonding. Thus, the non-doped polysilicon film 62 is interposed. In addition, the insulation oxide film 63 is interposed for insulation between the doped polysilicon film 64 and non-doped polysilicon film 62.

In the above-described arrangement, in order to provide a potential to the protective cap featured by the present invention, it is required to electrically connect the doped polysilicon wiring layer 66 of the shield electrode provided at the upper part of the substrate 9 to the protective cap 4. In order to obtain conductivity between both of them, as shown in FIG. 7, a hole part 65a is provided at the insulation nitride film 65 formed on the doped polysilicon wiring layer 66 of the shield electrode. Further, a contact part 68 is provided between the doped polysilicon film 64 and non-doped polysilicon film 62, and is then heated, whereby a portion 71 at which impurities of the doped polysilicon are dispersed is formed in a partial region of the non-doped polysilicon film 62.

In this manner, an electrically conductive path (path) 67 which is partially electrically conductive to the protective cap 4 is formed via the hole 65a formed at the insulation nitride film 65 from the doped polysilicon wiring layer 66, the doped polysilicon layer 64, and the doped polysilicon impurity dispersion part 71 or the like, whereby a potential can be provided to the protective cap 4.

In addition, a movable electrode and the above-mentioned shield layer are electrically connected to each other via the electrically conductive path 67 formed on a part of the support part (64) of the protective cap. Such an electrically conductive path (path) may be composed in a pattern shape formed in the inner and outer face or by embedding an electrically conductive material of a through hole.

With such an arrangement, the effect similar to that in the embodiment 1 is achieved, and a space for providing an electrically conductive path is not required in particular, which is effective in miniaturization. In the above arranged semiconductor acceleration sensor, at least any of the semiconductor substrate, shield electrode layer, and protective cap are made identical to the movable electrode in potential, whereby the similar effect is achieved.

Embodiment 3

Figure 8:
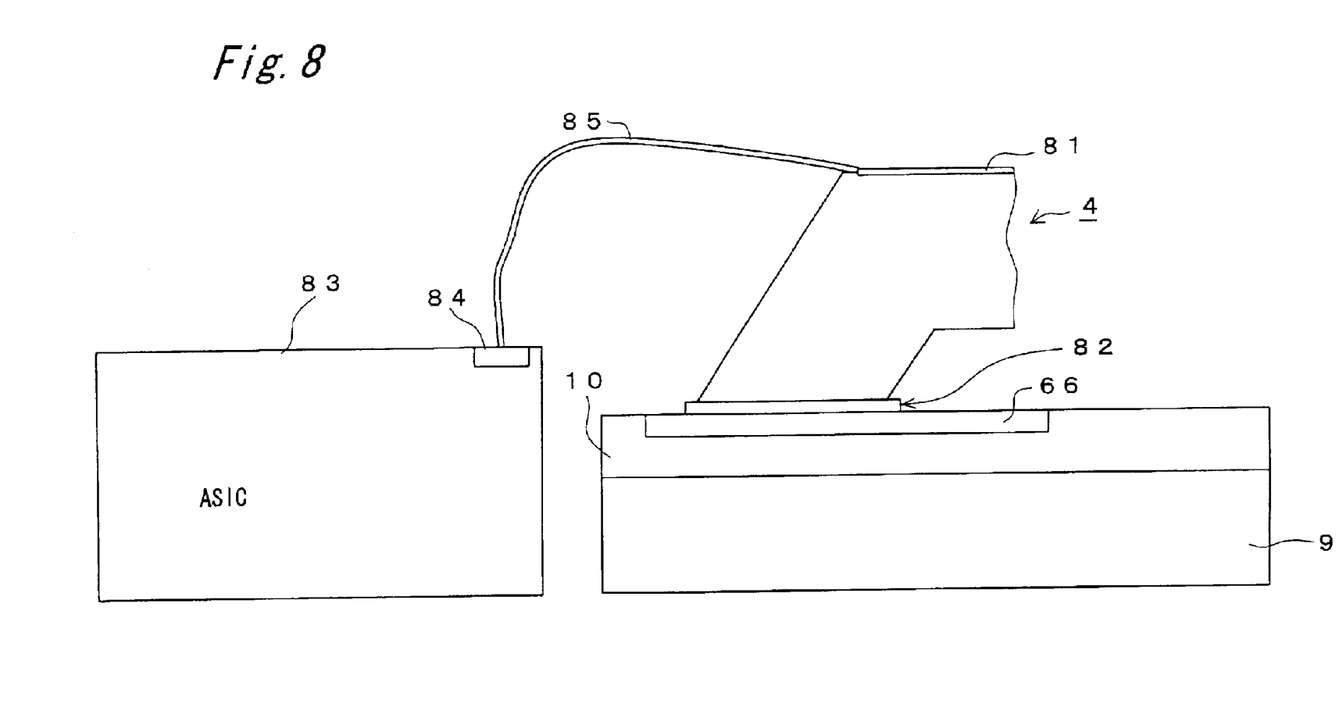
FIG. 8 is a view of general arrangement illustrating an assembly arrangement of a sensor chip par and a signal processing part according to the embodiment 3 of the present invention.

An embodiment 3 of the present invention will be described below referring to FIG. 8. FIG. 8 is a schematic view provided to illustrate a general arrangement of the embodiment 3. As shown in the figure, according to the embodiment 3, the protective cap 4 is formed on the doped polysilicon wiring layer 66 of the shield electrode 14 via an insulation or electrically conductive adhesive agent 82, and a metal film 81 made of aluminum or the like is formed in advance on the outer face at the upper part of the protective cap 4.

In order to provide a potential to such a protective cap 4, the protective cap is electrically connected to an electrically conductive metal film 81 formed on the outer face of the upper part of the protective cap 4 directly from an electrode pad 84 of a signal processing ASIC 83 via a bonding wire 85 such as an Au wire, which is identical to each other in potential.

With the above-described arrangement, the protective cap and movable electrode can be made identical in potential with a simple structure. Thus, the similar effect to that in the previously described embodiments 1 and 2 is achieved, and there is an effect that an acceleration sensor can be provided inexpensively.

Embodiment 4

Figure 9:
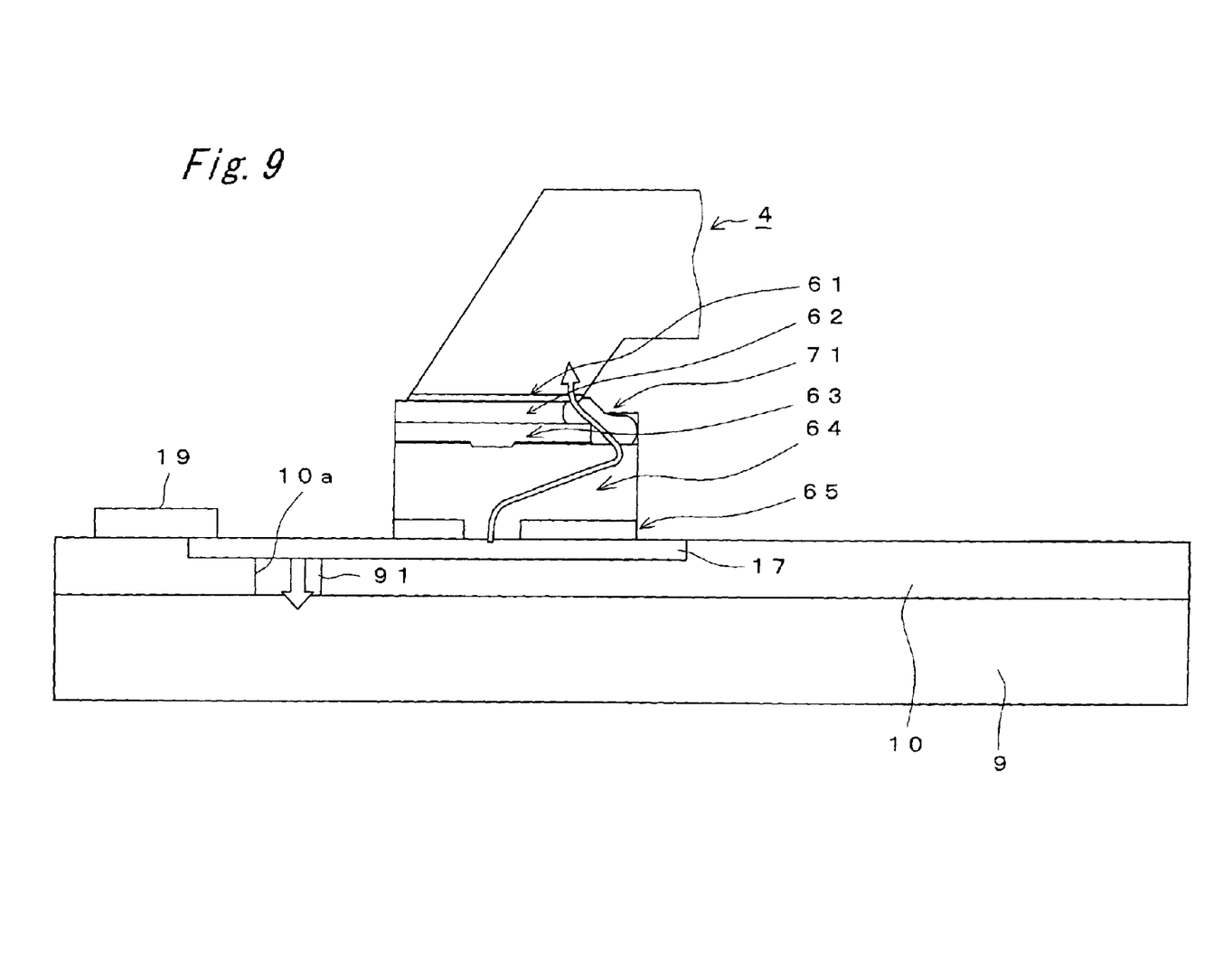
FIG. 9 is a sectional view illustrating a general arrangement of a sensor chip part according to the embodiment 4 of the present invention.

An embodiment 4 of the present invention will be described below referring to FIG. 9. FIG. 9 is a sectional view provided to illustrate a general arrangement of the embodiment 4. As shown in the figure, the embodiment 4 is structurally analogous to the embodiment 2 shown in FIG. 7. These embodiments are different from each other as follows. That is, in the embodiments 1, 2 and 3, the shield electrode is provided at the lower side relevant to the movable electrode, and the protective cap is provided at the upper side, thereby achieving the shield effect. In contrast, in the embodiment 4, the substrate 9 of the sensor chip as well is made identical to the movable electrode in potential in order to make the shield effect more reliable.

That is, as shown in FIG. 9, a hole part 10a is provided on a part of the insulation oxide film 10 provided to insulate electrodes each from the silicon substrate 9, and doped silicon 91 is charged in the hole part, whereby the doped polysilicon wiring layer 66 and substrate 9 are electrically connected to each other to be conductive to each other, thereby making the shield effect reliable.

However, a substrate of ASIC (5) is generally set at a GND potential. Thus, both of the chips are bonded on a die pad by an insulation die bonding agent such as silicon resin so as not to short-circuit the substrate of ASIC (5) and the substrate 9 of the sensor chip 3 set at the same potential as that of the movable electrode.

In this manner, in the embodiment 4, the sensor chip 3 and the signal processing IC 5 connected to the sensor chip 3 are securely bonded on the die pad 2. In addition, an output terminal of the capacity/voltage conversion circuit 51 of the signal conversion IC 5 and an aluminum pad 19 provided on the top face of the sensor chip 3 are connected to each other via a bonding wire 20, and these elements are resin-shielded.

With the above-described arrangement, the shield effect can be made reliable, and the sensor chip and the signal processing IC are disposed to be adjacent to each other. Thus, miniaturization and cost reduction can be achieved.

Embodiment 5

Figure 10:
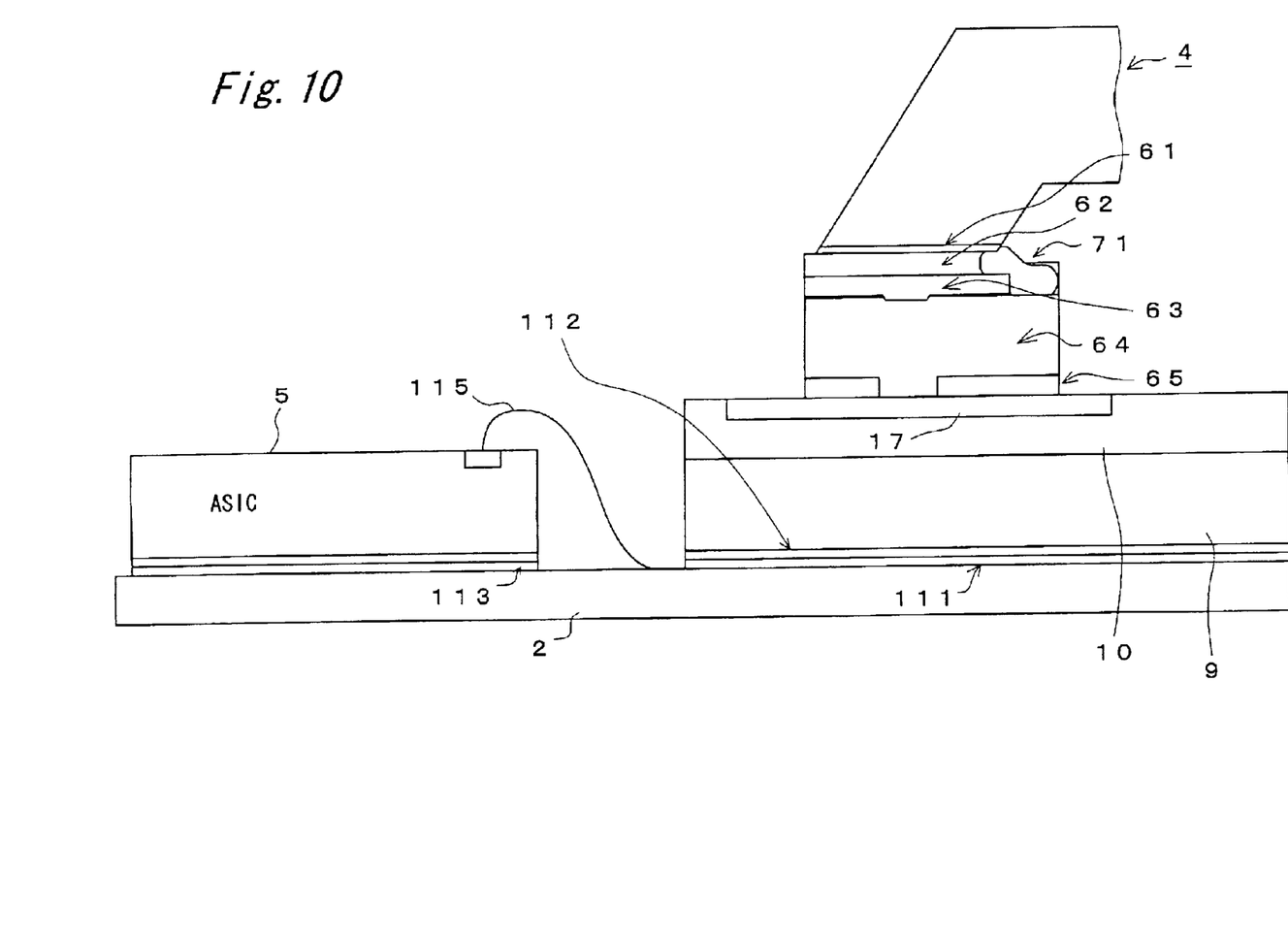
FIG. 10 is a view of general arrangement illustrating an assembly arrangement of the sensor chip part and signal processing part according to the embodiment 5 of the present invention.

An embodiment 5 of the present invention will be described below referring to FIG. 10. FIG. 10 is a sectional view provided to illustrate a general arrangement of the embodiment 5. As shown in the figure, the embodiment 5 is structurally identical to the embodiment 2 shown in FIG. 7 in arrangement of the protective cap 4 or the lie disposed to be bonded on the substrate 9 of the sensor chip 3.

In the embodiment 5, in order to provide the same potential as the movable electrode to the substrate 9 of the sensor chip 3, as shown in FIG. 10, a back face metalized layer 112 such as Ti/Ni/Au is formed at the back face (lower face) part of the substrate 9 of the sensor chip 3. This back face metalized layer 112 is bonded via an electrically conductive bonding agent 111 such as Ag paste formed on the top face of the die pad 2, and is arranged so as to be electrically conductive to the die pad 2 when the back face of the sensor chip is die bonded.

In addition, an Au wire 115 is directly implanted in the upper face part of the die pad 2 from the electrode pad 21 of ASIC 5 securely bonded on the die pad 2, whereby the same potential as the movable electrode is provided to the substrate 9 of the sensor chip 3, as achieved in the embodiment 4.

In the above-described arrangement, the substrate of ASIC 5 is generally set at a GND potential. Thus, ASIC 5 is die bonded on the die pad 2 via an insulation adhesive agent 113 such as silicon resin so as not to short the substrate of ASIC 5 and die pad 2 (identical to the movable electrode in potential).

In this manner, in the embodiment 5, the semiconductor (silicon) substrate 9 of the sensor chip is securely bonded on the die pad 2 via an electrically conductive bonding agent 111, and the signal processing IC 5 connected to the sensor chip is securely bonded on the die pad 2 via an insulation adhesive agent 113, and the output terminal of the capacity/voltage conversion circuit 51 of the signal processing IC 5 is connected to the die pad 2 via a bonding wire 115, the same potential as the movable electrode is provided to the substrate 9 of the sensor chip 3, and these elements are resin sealed.

With the above-described arrangement, there is no need to connect a bonding wire to a semiconductor portion such as protective cap. Thus, there is no possibility that breakage due to a shock during wire bonding occurs. Therefore, manufacturing cost reduction and miniaturization due to thinning of the semiconductor portion can be achieved.

In summarizing the present invention, according to a first aspect of the present invention, a semiconductor acceleration sensor includes: a sensor chip connected to a signal processing IC on a die pad; a stationary electrode and a movable electrode which are arranged on a semiconductor substrate of the sensor chip; a protective cap covering the stationary electrode and movable electrode; a shield layer which is embedded in a top face part of the semiconductor substrate; and a sealing resin for sealing the stationary electrode and the movable electrode. In this configuration, at least one of the shield layer and the protective cap is electrically connected to the movable electrode, thereby being identical to each other in potential.

With this arrangement, there can be provided a semiconductor acceleration sensor in which the movable electrode is prevented from being securely bonded with the substrate by an electrostatic attracting force and being inoperable, and the entire arrangement is simple and inexpensive.

According to a second aspect of the present invention, in the configuration of the first aspect mentioned above, an output terminal of a capacity/voltage conversion circuit of the signal processing IC and a top face of the sensor chip may be connected to each other via a bonding wire. Moreover, a potential of the movable electrode may be obtained as an output potential of a capacity/voltage conversion circuit of the signal processing IC.

With this arrangement, there can be obtained an effect that the movable electrode can be securely prevented from being bonded with the substrate by an electrostatic attracting force and from being inoperable, and the entire arrangement is further simple and inexpensive.

According to a third aspect of the present invention, in a bonding arrangement having the protective cap bonded on the semiconductor substrate in the configuration of the first aspect mentioned above, there may be provided a laminate structure in which an insulation nitride film is formed on the shield layer, a semiconductor support layer is formed on the insulation nitride film, an insulation oxide film is formed on the semiconductor support layer, and a bonding semiconductor layer to be used for cap bonding is formed on the insulation oxide film.

Moreover, in this configuration, a hole part may be provided in the insulation nitride film, a portion at which impurities of a constituent material of the semiconductor support layer is dispersed may be formed in a partial region of the bonding semiconductor layer, an electrically conductive path may be formed to be partially electrically conductive from the shield layer to the protective cap via the hole part formed in the insulation nitride film, via the semiconductor support layer, and via the impurity dispersion part, and the shield layer and the protective cap may be electrically connected to each other via the electrically conductive path.

In addition, the movable electrode and the shield layer may be electrically connected to each other via the electrically conductive path formed on a part of the semiconductor support layer of the protective cap.

With such an arrangement, an effect similar to that of the embodiment 1 can be achieved, and a space for providing the electrically conductive path is not required in particular, which is effective in miniaturization.

Furthermore, in the configuration of the first aspect of the present invention, a metal film may be formed on an outer face of the protective cap, the signal processing IC may be provided with a terminal part having its same potential as the movable electrode, and the terminal part having the same potential and the metal film on the outer face of the protective cap may be electrically connected to each other via a bonding wire.

With such an arrangement, the protective cap can be identical to the movable electrode in potential with a simple arrangement. Thus, an inexpensive acceleration sensor can be provided.

Furthermore, in the configuration of the first aspect of the present invention, a hole part may be provided on a part of an insulation oxide film laminated on the semiconductor substrate top face part of the sensor chip, and a semiconductor material may be filled to be doped in the hole part, whereby the shield layer and the semiconductor substrate of the sensor chip may be electrically connected to each other.

With such an arrangement, the shield effect can be reliably achieved, and the sensor chip and signal processing IC can be disposed adjacently each other, thus making it possible to achieve miniaturization and low cost.

Furthermore, in the configuration of the second aspect of the present invention, the semiconductor substrate of the sensor chip may be bonded on the die pad by an electrically conductive adhesive agent, the signal processing IC may be connected onto the die pad by an insulation adhesive agent, an output terminal of the capacity/voltage conversion circuit of the signal processing IC and the die pad may be connected to each other via a bonding wire, and the semiconductor substrate of the sensor chip and the movable electrode are identical to each other in potential.

With this arrangement, no bonding wire is connected to a semiconductor portion such as protective cap. Thus, there is no danger that breakage due to a shock during wire bonding occurs. Therefore, reduction of the manufacturing cost and miniaturization due to thinning of the semiconductor portion can be achieved.

As described above, according to the present invention, an output of a capacity/voltage conversion circuit identical to a movable electrode in potential is provided to a shield electrode, whereby the secure bonding of the movable electrode can be prevented without lowering sensitivity of the sensor. Therefore, a proper shield effect can be achieved. In addition, a potential difference is eliminated between the movable electrode and shield electrode, and an electrostatic attracting force is not generated. Thus, there is achieved an effect that the secure bonding of the movable electrode can be reliably prevented. In addition, the shield effect can be made reliable, and the disposition and arrangement of the sensor chip and signal processing IC are improved, thereby making it possible to achieve miniaturization and low cost.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor acceleration sensor comprising:
  a sensor chip connected to a signal processing IC on a die pad, said sensor chip having a semiconductor substrate;
  a stationary electrode and a movable electrode arranged on said semiconductor substrate of said sensor chip;
  a protective cap covering said stationary electrode and said movable electrode;
  a shield layer which is embedded in a top face part of said semiconductor substrate; and
  a sealing resin configured to seal said stationary electrode and said movable electrode,
  wherein at least one of said shield layer and said protective cap is electrically connected to said movable electrode, thereby being identical to each other in potential.

2. The semiconductor acceleration sensor as claimed in claim 1, wherein an output terminal of a capacity/voltage conversion circuit of said signal processing IC and a top face of said sensor chip are connected to each other via a bonding wire.

3. The semiconductor acceleration sensor as claimed in claim 1, wherein, in a bonding arrangement in which said protective cap is bonded on said semiconductor substrate, there is provided a laminate structure in which an insulation nitride film is formed on said shield layer, a semiconductor support layer is formed on said insulation nitride film, an insulation oxide film is formed on said semiconductor support layer, and a bonding semiconductor layer to be used for cap bonding is formed on the insulation oxide film.

4. The semiconductor acceleration sensor as claimed in claim 3, wherein a hole part is provided in said insulation nitride film, a portion at which impurities of a constituent material of said semiconductor support layer is dispersed is formed in a partial region of said bonding semiconductor layer, an electrically conductive path which is partially electrically conductive from said shield layer to said protective cap via the hole part formed in said insulation nitride film, said semiconductor support layer, and said impurity dispersion part is formed, and said shield layer and said protective cap are electrically connected to each other via said electrically conductive path.

5. The semiconductor acceleration sensor as claimed in claim 4, wherein said movable electrode and said shield layer are electrically connected to each other via said electrically conductive path formed on a part of said semiconductor support layer of said protective cap.

6. The semiconductor acceleration sensor as claimed in claim 1, wherein a potential of said movable electrode is obtained as an output potential of a capacity/voltage conversion circuit of said signal processing IC.

7. The semiconductor acceleration sensor as claimed in claim 1, wherein a metal film is formed on an outer face of said protective cap, said signal processing IC is provided with a terminal part having a same potential as said movable electrode, and said terminal part having said same potential and the metal film on the outer face of said protective cap are electrically connected to each other via a bonding wire.

8. The semiconductor acceleration sensor as claimed in claim 1, wherein a hole part is provided on a part of an insulation oxide film laminated on the semiconductor substrate top face part of said sensor chip, and a semiconductor material is filled to be doped in the hole part, whereby said shield layer and the semiconductor substrate of said sensor chip are electrically connected to each other.

9. The semiconductor acceleration sensor as claimed in claim 6, wherein the semiconductor substrate of said sensor chip is bonded on said die pad by an electrically conductive adhesive agent, said signal processing IC is connected onto said die pad by an insulation adhesive agent, an output terminal of the capacity/voltage conversion circuit of said signal processing IC and said die pad are connected to each other via a bonding wire, and the semiconductor substrate of said sensor chip and said movable electrode are identical to each other in potential.

10. The semiconductor acceleration sensor as claimed in claim 1, wherein said movable electrode is configured to move toward said stationary electrode along said shield layer.

11. The semiconductor acceleration sensor as claimed in claim 1, wherein said signal processing IC comprises:

a capacity/voltage conversion circuit electrically connected to said movable electrode and configured to detect a capacitance change between said stationary electrode and said movable electrode and to convert the detected capacitance into a voltage, wherein an output of said capacity/voltage conversion circuit is electrically connected to said at least one of said shield layer and said protective cap.

12. The semiconductor acceleration sensor as claimed in claim 1, wherein said protective cap and said movable electrode are electrically connected to said signal processing IC, thereby being identical to each other in potential.

13. The semiconductor acceleration sensor as claimed in claim 1, wherein said movable electrode and said at least one of said shield layer and said protective cap are electrically connected to each other via said signal processing IC.

\* \* \* \* \*